(12) United States Patent
Rosenquist et al.

(10) Patent No.: US 6,502,869 B1
(45) Date of Patent: *Jan. 7, 2003

(54) POD DOOR TO PORT DOOR RETENTION SYSTEM

(75) Inventors: Frederick T. Rosenquist, Redwood City; Michael Ng, Campbell, both of CA (US)

(73) Assignee: Asyst Technologies, Inc., Fremont, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/115,414

(22) Filed: Jul. 14, 1998

(51) Int. Cl.[7] ................................................. E05C 5/02
(52) U.S. Cl. ............................ 292/59; 292/57; 292/202
(58) Field of Search ........................... 292/202, 57, 58, 292/59, 62, 144, 60, 61, 4, 5, 6, DIG. 57, 256.73; 414/217, 939, 940

(56) References Cited

U.S. PATENT DOCUMENTS

| 875,087 A | * 12/1907 | Mackintosh ................... 292/57 |
| 1,040,963 A | * 10/1912 | Strong et al. .................. 292/57 |
| 2,480,434 A | * 8/1949 | Askin ..................... 292/256.73 |
| 2,493,882 A | * 1/1950 | Lambert ...................... 292/48 |
| 2,670,232 A | * 2/1954 | Schmitz ................. 292/256.73 |
| 3,179,457 A | * 4/1965 | Johnson ........................ 292/60 |
| 3,891,253 A | * 6/1975 | Revell .......................... 292/59 |
| 4,190,272 A | * 2/1980 | Beard ......................... 292/251 |
| 4,413,848 A | * 11/1983 | Leaver et al. .................. 292/59 |
| 4,532,970 A | * 8/1985 | Tullis et al. ................... 141/98 |
| 4,534,389 A | * 8/1985 | Tullis .......................... 141/98 |
| 4,688,835 A | 8/1987 | Wu .............................. 292/59 |
| 4,730,469 A | * 3/1988 | Hanel et al. .................... 70/81 |
| 4,995,430 A | * 2/1991 | Bonora et al. ................. 141/98 |
| 5,165,738 A | 11/1992 | McCormack ................ 292/67 |
| 5,462,249 A | * 10/1995 | Calzone ................... 248/316.7 |
| 5,584,514 A | * 12/1996 | Mascotte ...................... 292/57 |
| 5,653,565 A | * 8/1997 | Bonora et al. ............... 414/411 |
| 5,683,123 A | * 11/1997 | Ruoss .......................... 292/57 |
| 5,772,386 A | * 6/1998 | Mages et al. ................ 414/411 |
| 5,788,458 A | * 8/1998 | Bonora et al. ............... 414/786 |
| 5,944,475 A | * 8/1999 | Bonora et al. ............... 414/754 |
| 6,135,698 A | * 10/2000 | Bonora et al. ............... 414/416 |

FOREIGN PATENT DOCUMENTS

| GB | 27569 | * 11/1897 | ................... 292/60 |
| GB | 191891 | * 1/1923 | ................... 292/57 |
| WO | WO 99/33726 | 7/1999 | |

OTHER PUBLICATIONS

Mihir Parikh, et al., SMIF: A Technology for Wafer Cassette Transfer in VLSI Manufacturing, (07/84), Solid State Technology, pp. 111–115.

Notification of Transmittal of the International Search Report or the Declaration, International Searching Authority, Oct. 21, 1999, 4 pages.

Supplementary European Search Report, European Patent Office, Oct. 29, 2001, 3 pages.

U.S. patent application Ser. No. 08/998,115, Bonora et al., filed Dec. 24, 1997.

* cited by examiner

Primary Examiner—Teri Pham Luu
(74) Attorney, Agent, or Firm—O'Melveny & Myers, LLP

(57) ABSTRACT

A system is disclosed for ensuring that the pod door is firmly and securely retained on the port door of a process tool as the pod door is removed from the pod and stowed in the process tool during workpiece transfer between the pod and process tool. The system includes a latch key protruding outwardly from the outer surface of the port door. The latch key is provided to mate within a slot of a door latch assembly within the pod door. Once the latch key is properly seated within the slot, the latch key is rotated by mechanisms within the port door to decouple the pod door from the pod shell. Such rotation at the same time couples the pod door to the port door. According to the present invention, while the latch key rotates, it simultaneously moves in the rearward direction (i.e., back toward the port door) to thereby pull the pod door into a tight engagement with the port door.

31 Claims, 6 Drawing Sheets

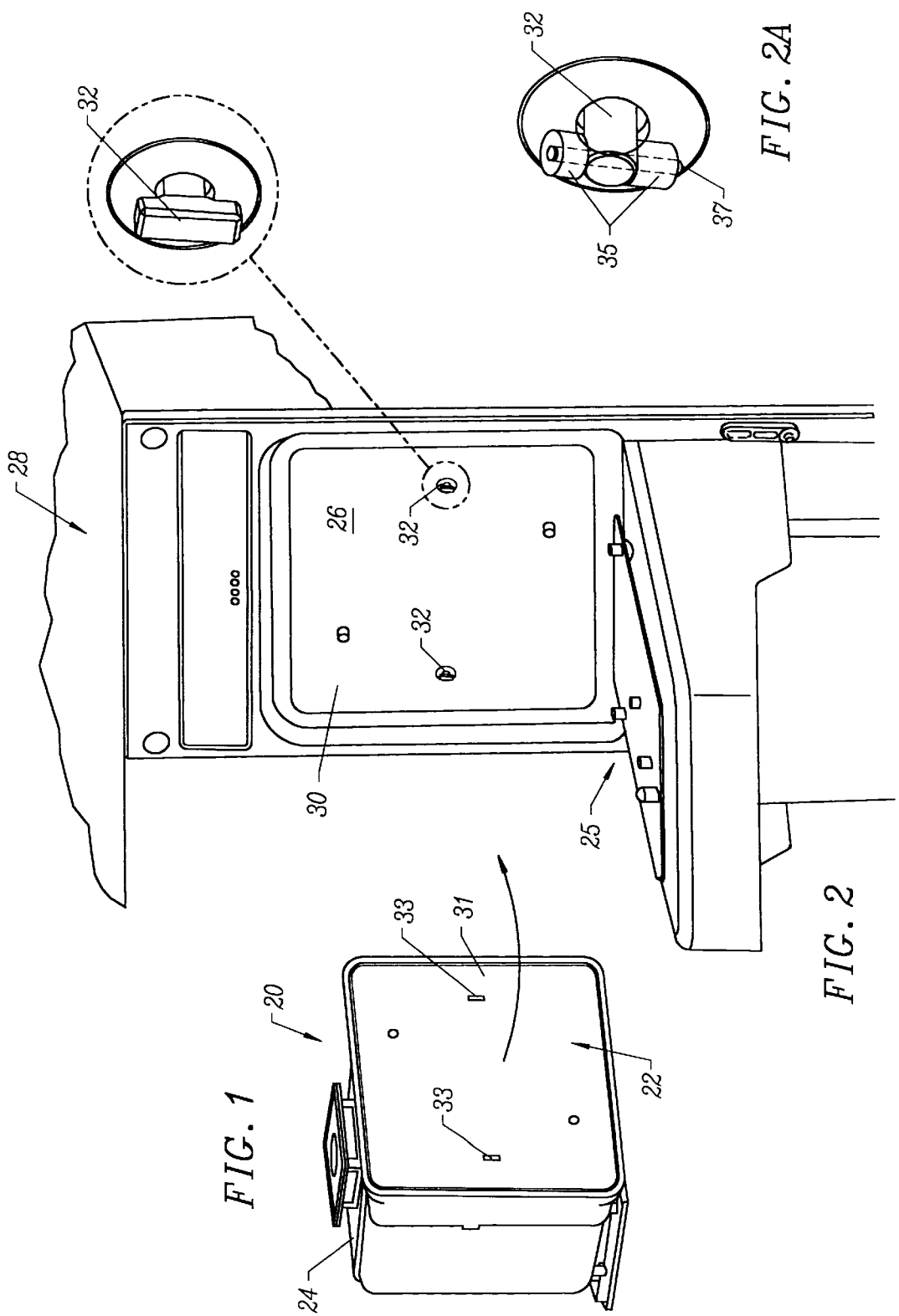

POD DOOR TO PORT DOOR RETENTION SYSTEM

BACKGROUND OF THE INVENTION

1. Field of the Invention

The present invention relates to the transfer of workpieces such as semiconductor wafers from a storage and transport pod to a process tool, and in particular to a system for ensuring that the pod door is firmly and securely retained on the port door as the pod door is removed from the pod and stowed in the process tool during workpiece transfer between the pod and process tool.

2. Description of Related Art

A SMIF system proposed by the Hewlett-Packard Company is disclosed in U.S. Pat. Nos. 4,532,970 and 4,534,389. The purpose of a SMIF system is to reduce particle fluxes onto semiconductor wafers during storage and transport of the wafers through the semiconductor fabrication process. This purpose is accomplished, in part, by mechanically ensuring that during storage and transport, the gaseous media (such as air or nitrogen) surrounding the wafers is essentially stationary relative to the wafers, and by ensuring that particles from the ambient environment do not enter the immediate wafer environment.

A SMIF system has three main components: (1) minimum volume, sealed pods used for storing and transporting wafers and/or wafer cassettes; (2) an input/output (I/O) minienvironment located on a semiconductor processing tool to provide a miniature clean space (upon being filled with clean air) in which exposed wafers and/or wafer cassettes may be transferred to and from the interior of the processing tool; and (3) an interface for transferring the wafers and/or wafer cassettes between the SMIF pods and the SMIF minienvironment without exposure of the wafers or cassettes to particulates. Further details of one proposed SMIF system are described in the paper entitled "SMIF: A TECHNOLOGY FOR WAFER CASSETTE TRANSFER IN VLSI MANUFACTURING," by Mihir Parikh and Uhrich Kaempf, *Solid State Technology*, July 1984, pp. 111–115.

Systems of the above type are concerned with particle sizes which range from below 0.02 microns ($\mu$m) to above 200 $\mu$m. Particles with these sizes can be very damaging in semiconductor processing because of the small geometries employed in fabricating semiconductor devices. Typical advanced semiconductor processes today employ geometries which are one-half $\mu$m and under. Unwanted contamination particles which have geometries measuring greater than 0.1 $\mu$m substantially interfere with $\mu$m geometry semiconductor devices. The trend, of course, is to have smaller and smaller semiconductor processing geometries which today in research and development labs approach 0.1 $\mu$m and below. In the future, geometries will become smaller and smaller and hence smaller and smaller contamination particles and molecular contaminants become of interest.

SMIF pods are in general comprised of a pod door which mates with a pod shell to provide a sealed environment in which wafers may be stored and transferred. So called "bottom opening" pods are known, where the pod door is horizontally provided at the bottom of the pod, and the wafers are supported in a cassette which is in turn supported on the pod door. It is also known to provide "front opening" pods, in which the pod door is located in a vertical plane, and the wafers are supported either in a cassette mounted within the pod shell, or to shelves mounted in the pod shell. For both front opening and bottom opening pods, a pod door includes a front surface which is included as part of the sealed pod environment, and a rear surface which is exposed to the environment of the wafer fab.

In order to transfer wafers between a SMIF pod and a process tool within a wafer fab, a pod is typically loaded either manually or automatedly onto a load port on a front of the tool. The process tool includes an access port which, in the absence of a pod, is covered by a port door which includes a front surface exposed to the wafer fab environment and a rear surface which is part of the sealed environment within the process tool. The SMIF pod is seated on the load port so that the pod door and port door lie adjacent to each other. Registration pins are provided on the port door that mate with grooves in the pod door to assure a proper alignment of the pod door with respect to the port door.

Once the pod is positioned on the load port, mechanisms within the port door unlatch the pod door from the pod shell and move the pod door and port door together into the process tool where the doors are then stowed away from the wafer transfer path. The pod shell remains in proximity to the interface port so as to maintain a clean environment including the interior of the process tool and the pod shell around the wafers. A wafer handling robot within the process tool may thereafter access particular wafers supported in the pod for transfer between the pod and the process tool.

It is extremely important to provide a clean, low particulate and contaminant environment around the exposed wafers within the process tool. While the air within wafer fabs is typically filtered to some degree, the environment surrounding the process tools and SMIF pods include relatively high levels of particulates and contaminants as compared to within the pods and tools. As such, significant steps are taken to isolate SMIF pod and process tool interiors from the surrounding environment within the fab.

As explained above, the pod door and port door, even though having surfaces exposed to the environment of the wafer fab, are typically brought into the interior of the process tool in preparation for wafer transfer between the pod and the tool. In order to prevent the particulates and contaminants on the exposed door surfaces from contaminating the interior of the process tool, it is known to hold the exposed pod and port door surfaces against each other when bringing the pod and port doors into the process tools and while the doors are positioned therein. Such contact may trap particulates and/or contaminants between the exposed surfaces to thereby prevent the transfer of the particulates and/or contaminants into the process tool.

Coupling mechanisms are known for coupling the pod door to the port door as the pod door is removed from the pod and stowed in the process tool. However, without additional restraints between the pod and port doors, it is possible that the pod door will vibrate on the port door, or that the pod door will tilt or otherwise move with respect to the port door. Any such vibration or movement may result in particulates and/or contaminants dislodging from the pod and/or port door surfaces and settling in the process tool.

Prior art attempts have been made to hold the pod door firmly against the port door while the doors are coupled together and stowed in the process tool. One such system is disclosed in U.S. Pat. No. 5,772,386, entitled "Loading and Unloading Station for Semiconductor Processing Installations", which patent is assigned to Jenoptik A. G. As set forth therein, the port door may include a pair of suction cups connected to a vacuum source. When the pod door is coupled to the port door, the suction cups engage a surface of the pod door, and the vacuum source creates suction within the cups to hold the pod door to the port door. In addition to the fact that particulates and contaminants may still escape from between the doors into the process tool, there is a further disadvantage to the disclosed system in that the vacuum source may fail or that the suction between the pod and port door may otherwise be lost. In such an instance, the pod door would potentially be able to vibrate or move around with respect to the port door as explained above. Moreover, this type of system requires a fab to provide a vacuum source as an additional utility to the process tool. Not only does this increase the cost and complexity of the tool design, but the control system must also include routines for monitoring the vacuum source to ensure proper operation.

SUMMARY OF THE INVENTION

It is therefore an advantage of the present invention to minimize the amount of particulates and contaminants that may dislodge from between the pod and port doors in the process tool.

It is another advantage of the present invention to provide a tight seal between the port and pod doors when the doors are latched together to prevent the escape of contaminants and/or particulates from between their juxtaposed surfaces.

It is a further advantage of the present invention to establish a tight seal between the port and pod doors entirely by mechanisms within the port and pod doors, without requiring additional monitors and/or utilities such as a vacuum source for the process tool.

It is a still further advantage of the present invention to provide a system for firmly holding the port and pod doors together, which system is manually adjustable to accommodate for varying thicknesses of the port and pod doors.

It is another advantage of the present invention to provide a self-adjusting system in addition to or instead of the above-described manual adjustment system for accommodating variations in port and pod door thicknesses and for providing for engineering tolerances.

It is another advantage of the present invention to provide a system capable of providing a tighter coupling of a pod door to a port door than with conventional suction systems.

These and other advantages are provided by the present invention, which in preferred embodiments relates to mechanisms for pulling the pod door tightly against the port door as the pod door is removed from the pod and stowed in the process tool during workpiece transfer between the pod and process tool. In a preferred embodiment, the mechanism includes a latch key protruding outwardly from the outer surface of the port door. The latch key is provided to mate within a slot of a door latch assembly within the pod door. Once the latch key is properly seated within the slot, the latch key is rotated by mechanisms within the port door to decouple the pod door from the pod shell. Such rotation at the same time couples the pod door to the port door. According to preferred embodiments of the present invention, while the latch key rotates, it simultaneously moves in the rearward direction (i. e., back toward the port door) to thereby pull the pod door into a tight engagement with the port door.

In order to provide rearward translation of the latch key upon rotation, in a preferred embodiment, the latch key is affixed to a shaft including a rear threaded section. The threaded section is received within a threaded nut mounted within the port door so that the rotation of the latch key also moves the latch key rearward with respect to the nut.

The nut may be affixed within the port door by screws fitting within adjustment slots provided through the nut. While the latch key is in a stationary position, loosening of the screws from within the adjustment slots allows rotation of the nut to the extent of the slots, which in turn translates the latch key forward or rearward with respect to the outer surface of the port door. This adjustment mechanism allows the height of the latch key in front of the port door surface to be adjusted to accommodate variations in pod door thicknesses. Moreover, as a given rotation of the nut will result in a relatively small translation of the latch key, the nut adjustment assembly is capable of providing fine adjustment of the position of the latch key past the surface of the port door. The adjustment may be made more or less fine by decreasing or increasing, respectively, the pitch of the threads. Altering the thread pitch will also vary the translation of the latch key for a given rotation of the latch key.

In alternative embodiments of the present invention, the nut may be mounted on a spring loaded plate which allows self-adjustment of the axial position of the latch key. Such an alternative embodiment accommodates variations in port and pod door thicknesses, and also provides for engineering tolerances within the port and pod doors.

The latch key and slot that receives the latch key preferably include smooth surfaces to minimize particulate generation as the latch key rotates in the slot. However, in the event particulates are generated, they are trapped within the pod door. In a further alternative embodiment, the latch key may be provided with rollers which lie in contact with the walls of the slot as the latch key rotates to further prevent particulate generation.

BRIEF DESCRIPTION OF THE DRAWINGS

The present invention will now be described with reference to the figures, in which:

FIG. 1 is a perspective view of a front opening SMIF pod located next to the port door of a process tool;

FIG. 2 is an enlarged perspective view of a portion of the outer surface of a port door including a latch key protruding outwardly therefrom;

FIG. 2A is an alternative latch key configuration to that shown in FIG. 2 including rollers;

DETAILED DESCRIPTION

Figure 3:
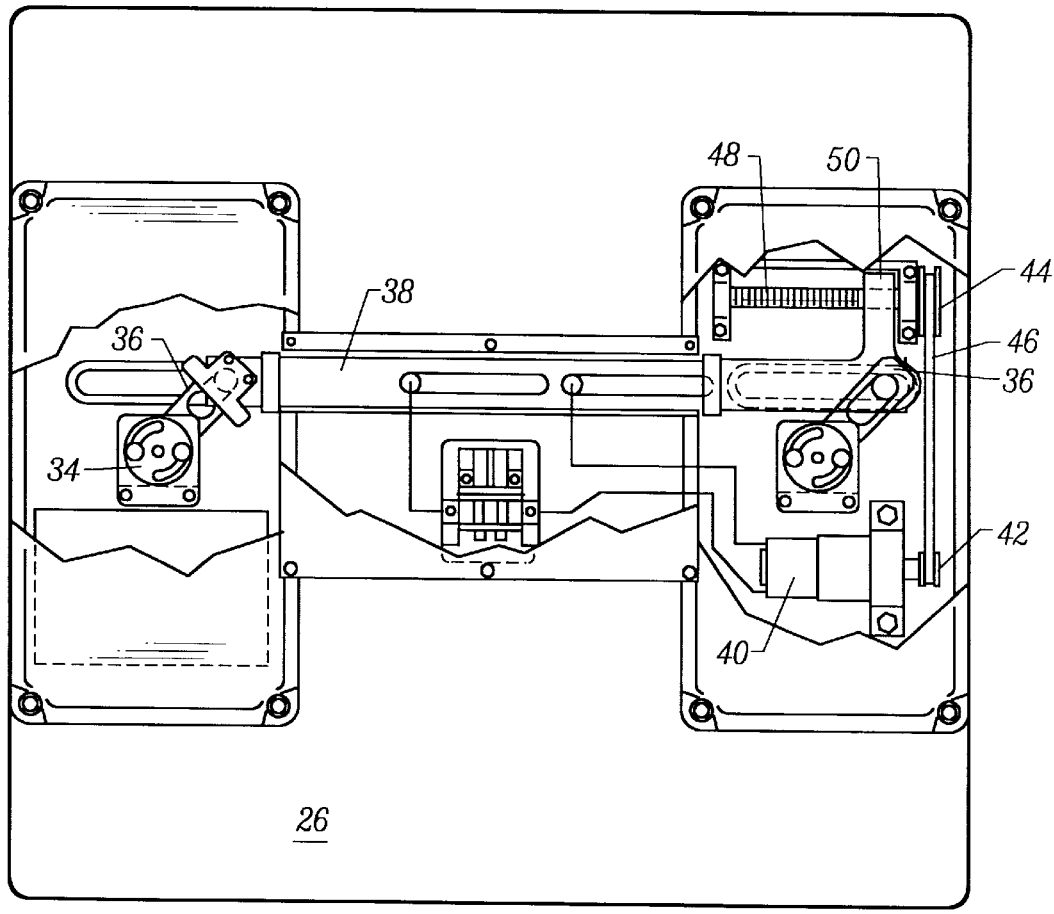
FIG. 3 is a front view of the interior of a port door including mechanisms for rotating the latch key.

The present invention will now be described with reference to FIGS. 1–7C which in preferred embodiments relate in general to mechanisms for decoupling a pod door from a pod and for tightly coupling the pod door to the port door as the pod door is removed from the pod and stowed in the process tool during workpiece transfer between the pod and process tool. While a preferred embodiment of the present invention operates in conjunction with a SMIF pod, it is understood that the present invention may operate with any of various containers. This includes 200 mm and 300 mm SMIF pods, bottom opening and front opening SMIF pods, and pods/boxes that do not operate according to SMIF technology. Additionally, the present invention may operate with containers carrying any of various workpieces, including wafers, reticles, and flat panel displays. The structure according to the present invention complies with and allows compliance with all applicable SEMI standards.

FIG. 1 is a perspective view of a 300 mm front opening SMIF pod 20 including a pod door 22 mating with a pod shell 24 to define a sealed environment for one or more workpieces located therein. (The rear of the pod door 20 would ordinarily be facing the port door as the pod is loaded on the port. It is shown otherwise in FIG. 1 for clarity.) While pod 20 is illustrated as a 300 mm front opening pod, as previously indicated, the size and type of the pod are not critical to the present invention. In order to transfer the workpieces between the pod 20 and a process tool 28, the pod is loaded onto a load port 25 adjacent a port door 26 on a front of the process tool. The type of process carried out within tool 28 is not critical to the present invention, and may be any of various testing, monitoring, and/or processing operations.

Referring now to FIGS. 1 and 2, a front surface 30 of the port door 26 faces a rear surface 31 of the pod door 22, and includes a pair of latch keys 32 for being received in a corresponding pair of slots 33 of a door latching assembly mounted within pod door 22. An example of a door latch assembly within a pod door adapted to receive and operate with latch key 32 is disclosed in U.S. Pat. No. 4,995,430 entitled "Sealable Transportable Container Having Improved Latch Mechanism", to Bonora et al., which patent is assigned to the owner of the present invention, and which patent is incorporated by reference herein in its entirety. In order to latch the pod door to the port door, the pod door 22 is seated adjacent the port door 26 so that the vertically oriented latch keys are received within the vertically oriented slots 33.

In addition to decoupling the pod door from the pod shell, rotation of the latch keys 32 will also lock the keys onto their respective slots 33, thus coupling the pod door to the port door. As explained in greater detail below, an alternative latch key 32 is shown in FIG. 2A including rollers 35 mounted on a pin 37 of the key. A preferred embodiment of the present invention includes two latch key 32 and slot 33 pairs, each of which pairs are structurally and operationally identical to each other. As such, the following description may at times discuss only one of the latch keys and/or slots. However, it is understood that the description of the latch keys and slots, and the components associated therewith, applies equally to both of the latch keys and slots. However, in alternative embodiments of the invention, the pod door may be coupled to the port door by a single latch key and slot pair, or more than two latch key and slot pairs. Moreover, it is understood that where there is more than one latch key/slot pair, the respective pairs need not be identical to each other in alternative embodiments of the invention.

While a preferred embodiment of the door latch assembly in the pod door has been described above, it is understood that the mechanisms in the pod door for coupling/uncoupling the pod door to the pod shell are not critical to the present invention and may vary significantly in alternative embodiments.

In a preferred embodiment, the latch keys 32 perform duel functions. They tightly couple/uncouple the port and pod doors, and they also actuate coupling/uncoupling of the pod door and pod shell. However, it is understood that the latch keys 32 may perform only one or the other of these functions in alternative embodiments. For example, in one such alternative embodiment, latch keys 32 provide no coupling/uncoupling functions between the pod door and pod shell. In such an embodiment, the latch key 32 would merely latch and unlatch the pod door to and from the port door in accordance with the principles of the present invention. An example of a system where the latch keys provide no coupling/uncoupling functions between the pod door and pod shell is disclosed for example in U.S. patent application Ser. No. 08/998,115 entitled "SMIF Pod Door and Port Door Removal and Return System", to Bonora et al., which application is assigned to the owner of the present invention, and which application is incorporated by reference in its entirety herein. Additionally, in a further alternative embodiment, the latch keys may only be provided to actuate coupling and uncoupling of the pod door to the pod shell. In such an embodiment, as discussed in greater detail below, mechanisms other than the latch keys 32 may be provided for tightly coupling and uncoupling the pod door to the port door.

Figure 4:
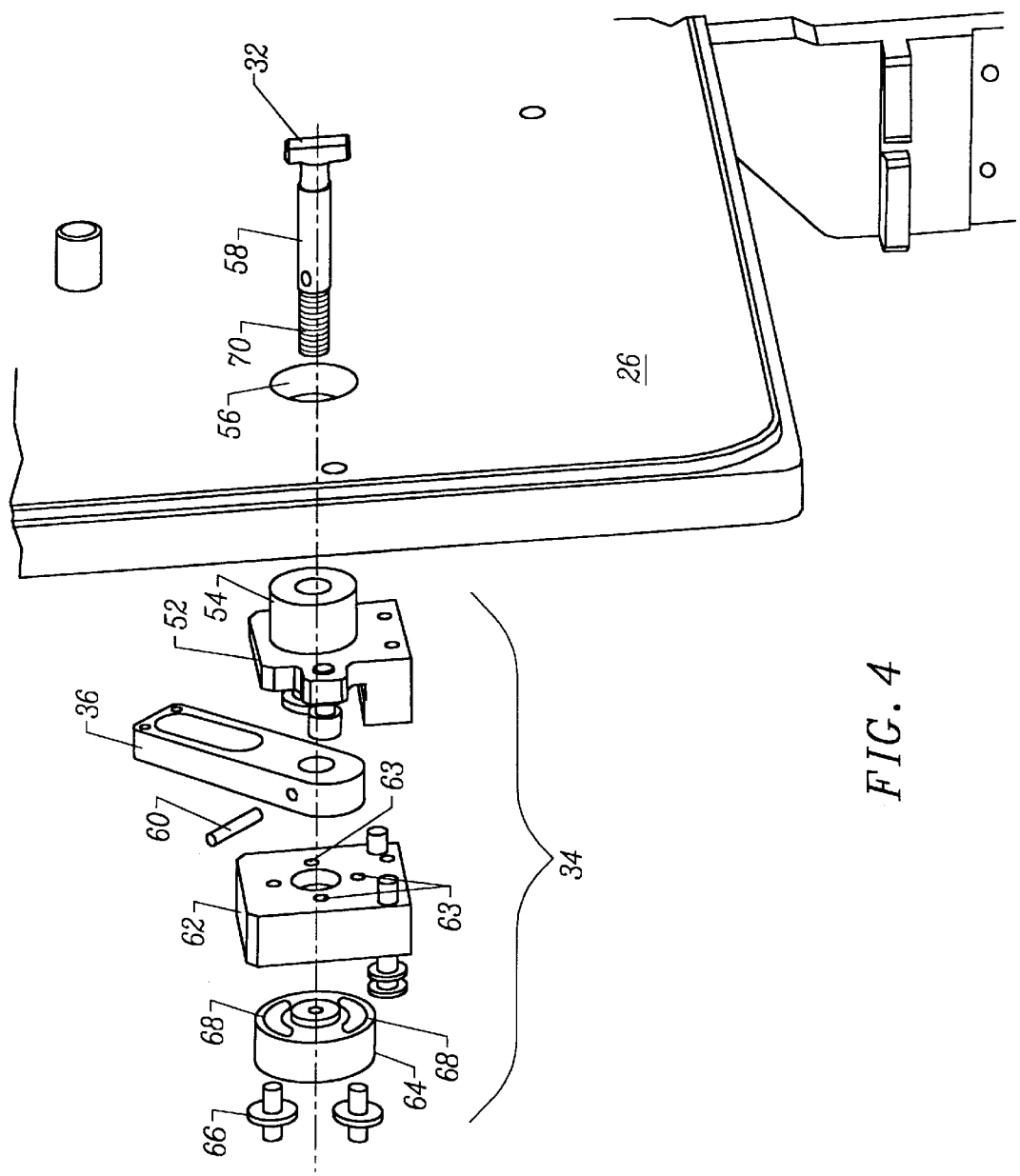
FIG. 4 is an exploded perspective view illustrating the latch key and mounting components according to the present invention for allowing rotation and translation of the latch key.

With respect now to preferred embodiments of the invention, the structures in the port door for actuating the latch keys 32 will be described with reference to the rear view of FIG. 3, and the perspective views of FIGS. 4 and 5. The latch keys 32 are affixed to respective latch key mounting assemblies 34, explained in greater detail below. An actuator 36 is fixedly mounted to each of the latch keys 32 (as best seen in FIG. 4) which actuators 36 are connected to each other by a translating rod 38. In a preferred embodiment, once a pod is seated adjacent a port door 26 (as indicated for example by a pod-at-port sensor), a motor 40 drives a pair of pulleys 42 and 44 attached to each other via a timing belt 46. Pulley 44 is in turn attached to a lead screw 48 having a carriage 50 mounted thereon, which carriage moves back and forth along the lead screw upon the screw rotation. The carriage 50 is in turn connected to the translating rod 38 affixed to the actuators 36. Thus, rotation of the motor will cause translation of the rod 38 and a pivoting of the actuators 36 to thereby rotate the latch keys 32. As would be appreciated by those of skill in the art, various mechanisms and linkages may be substituted for those described above for transferring torque from the motor to the actuators 36 to thereby rotate the latch keys 32.

Figure 5:
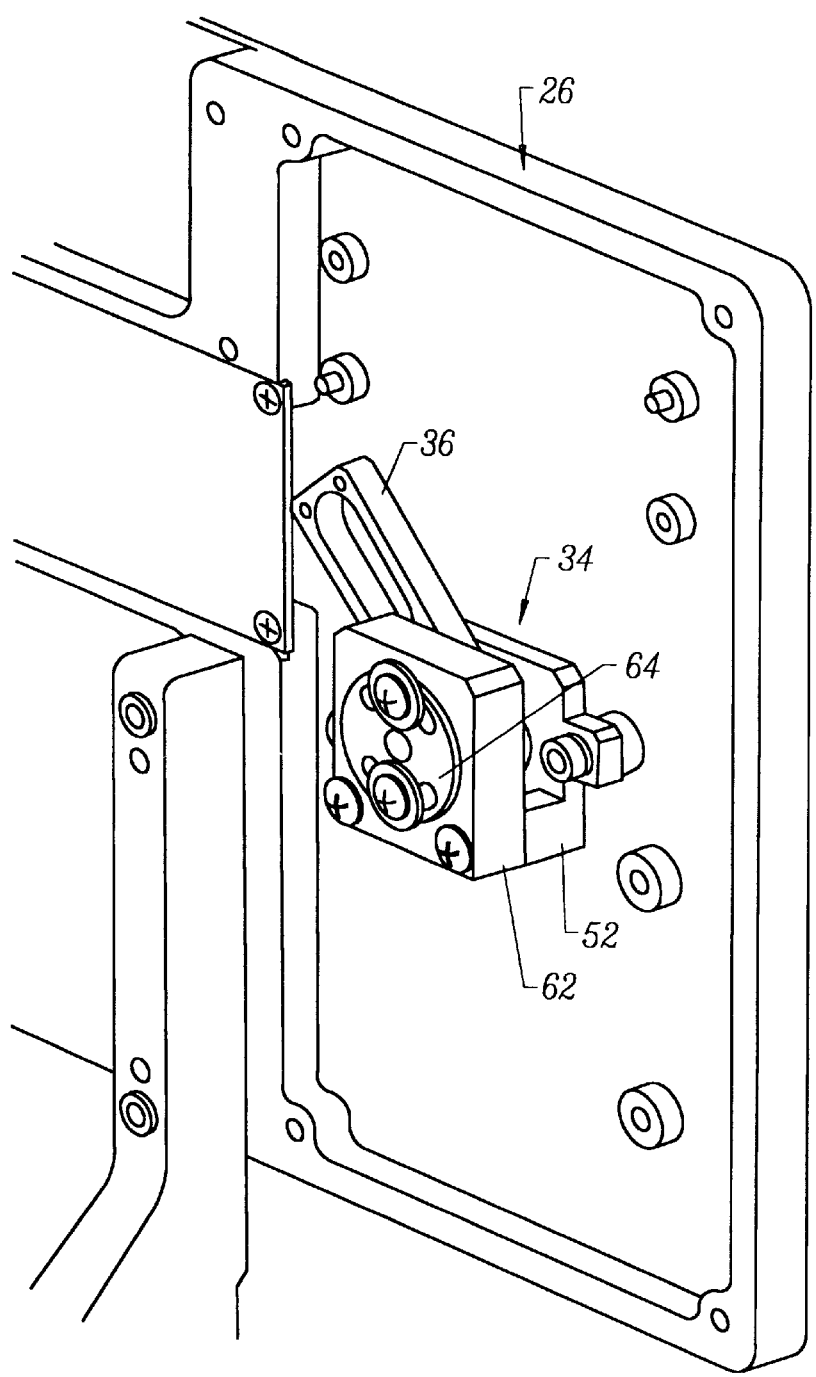
FIG. 5 is a perspective view of the assemblies mechanism in the port door for supporting, rotating and translating the latch key.

Referring specifically now to FIGS. 4 and 5, the latch key mounting assembly includes a stationarily mounted bearing support block 52 including a bearing 54 fitting within a hole 56 formed in the port door. The latch key 32 includes a shaft 58 extending rearwardly therefrom, which shaft is rotatably supported within bearing 54 of the bearing support block 52. As previously indicated, an actuator 36 is also mounted along the shaft 58 and, for example, secured thereto by a pin 60. Thus, the latch key 32 is constrained to rotate with the actuator 36.

The latch key mounting assembly 34 further includes a nut mounting block 62 which is stationarily mounted to the bearing support block 52. As the actuator 36 is fixedly mounted to the latch key shaft 58, a space may be provided between the nut mounting block 62 and the bearing support block 52 to allow slight translation of the actuator along the axis of rotation of the latch key as explained hereinafter.

The latch key mounting assembly 34 further includes an axial adjustment nut 64 which is adjustably mounted to the nut mounting block 62 by a pair of screws 66. In particular, the screws 66 fit through respective arcuately shaped slots 68 provided axially through the adjustment nut 64 and into one of two alternate pairs of countersunk holes 63 in the nut mounting block. Upon loosening of screws 66, the adjustment nut 64 may be rotated to the extent allowed by the slots 68. The two alternate pairs of countersunk hole 63 are provided (as opposed to one such pair) to allow adjustment of the adjustment nut around 360°. In particular, with the screws 66 provided in a first alternate pair of holes 63, the nut may be adjusted to a certain rotational extent (defined by the arc length of the slots 68). However, if the screws 66 are thereafter removed and inserted in the second alternate pair of holes 63, further rotational adjustment may then be obtained.

A rear section of latch key shaft 58 includes threads 70. The shaft 58 fits through the bearing 54, an opening in the actuator 36 and nut mounting block 62, and is received within the central opening of the adjustment nut 64. The central opening in the adjustment nut includes threads that mate with the threads 70. Thus, as in a common nut and bolt arrangement, any relative rotation between the adjustment nut 64 and the latch key 32 will also result in translation of the latch key with respect to the adjustment nut and the port door in general.

In operation, when a pod door is initially seated adjacent the port door and the latch key is received within the door latch assembly slot 33, motor 40 will rotate the actuators 36, which in turn rotate the respective latch keys 32 to lock the pod door onto the port door. Additionally, according to the present invention, rotation of the latch key threads 70 within the threaded central opening in the adjustment nut 64 causes the latch key 32 to move rearwardly toward the port door as it rotates. The latch key 32 will engage the rear walls of the slot 33 as it translates rearward, thereby pulling the pod door into tight engagement against the port door.

In a preferred embodiment of the present invention, the actuator 36 may rotate the pod door latch key approximately 90°. The pitch of threads 70 may be approximately 100 to 150 mils, so that a 90° rotation of the latch key results in an approximate 25 to 37 mils translation of the latch key back toward the surface of the port door. It is understood that the pitch of threads 70 may be lesser or greater than 100 to 150 mils in alternative embodiments of the present invention.

On occasion, thicknesses of the pod and/or port doors may vary, or it may otherwise be desirable to slightly adjust the distance by which the latch key protrudes past the front surface of the port door. In order to accomplish this, screws 66 are loosened to allow rotation of the axial adjustment nut 64. During such rotation, the actuators 36 prevent rotation of the latch keys, so that rotation of the adjustment nut 64 will axially translate the latch key to protrude a greater or lesser extent past the front surface of the port door. The degree to which the axial position of the latch keys may be adjusted can be varied by increasing or decreasing the arcuate lengths of the slots 68 in the axial adjustment nut 64 and/or by varying the pitch of threads 70. As a given rotation between the nut and latch key will result in a relatively small translation of the latch key, the nut adjustment assembly is capable of providing a fine adjustment of the position of the latch key past the surface of the port door. The adjustment may be made more or less fine by decreasing or increasing, respectively, the pitch of the threads 70. In alternative embodiments, it is understood that the slots 68 may be replaced by screw holes to omit the above-described adjustment feature.

Figure 6:
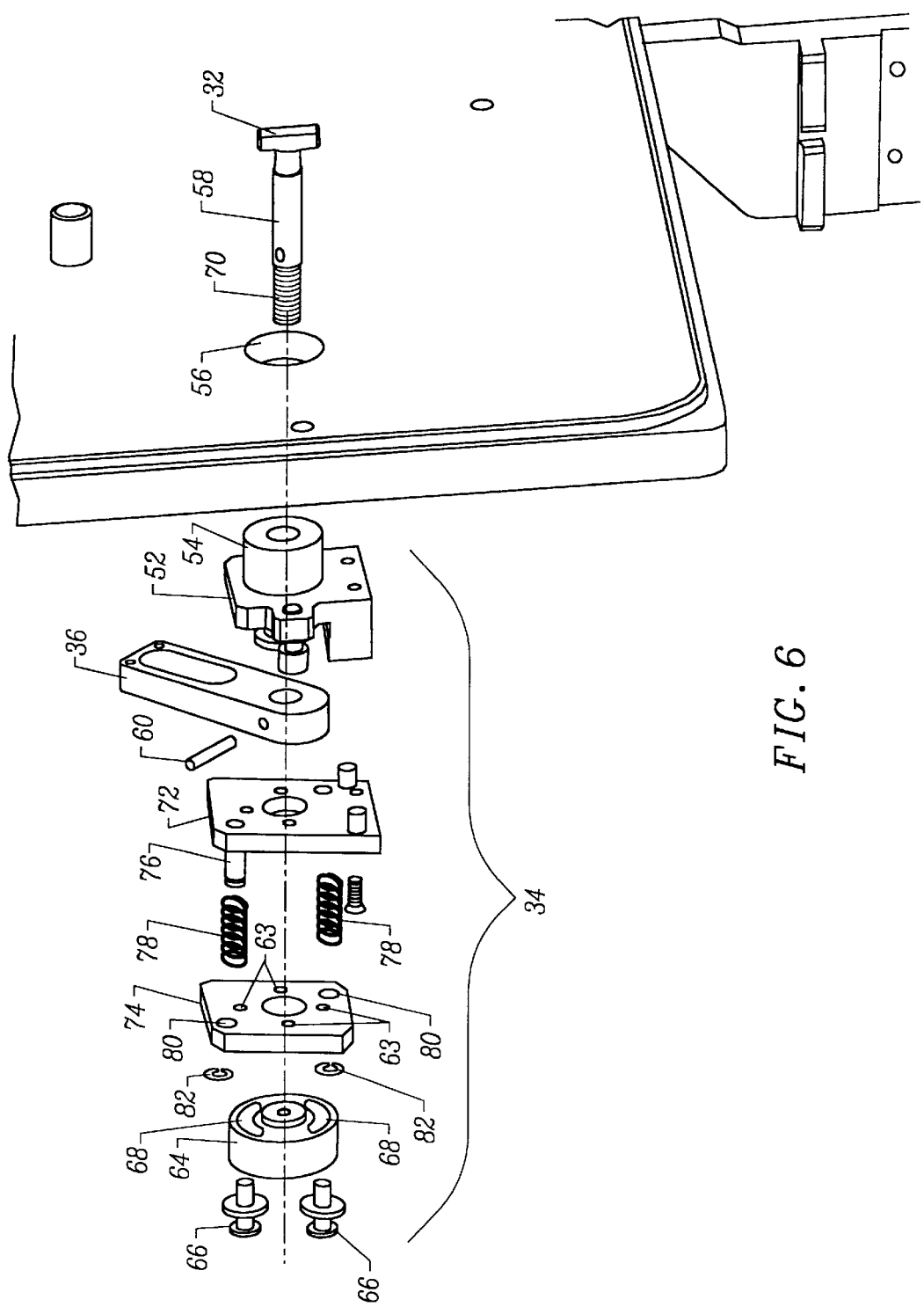
FIG. 6 is a perspective view of a latch key and mounting components for allowing rotation and translation of the latch key according to an alternative embodiment of the present invention.

An alternative embodiment of the present invention is shown in the exploded perspective view of FIG. 6. FIG. 6 is identical to the embodiment disclosed with respect to FIGS. 4 and 5 with the exception that the nut mounting block 62 of the above-described embodiments is omitted and is instead replaced generally by a guide pin block 72 and a nut mating plate 74. In particular, the guide pin block 72 is affixed to the bearing support block 52 so as to be stationarily mounted within the port door. The guide pin block 72 includes at least two rearwardly extending guide pins 76 which guide pins include springs 78 circumjacent thereabout. The nut mating plate 74 includes holes 80 corresponding in number and position to guide pins 76. Holes 80 have a slightly larger diameter than the guide pins 76, but a smaller diameter than that of springs 78. The nut mating plate 74 is affixed to the guide pin block 72 by retaining rings 82, which are fastened to a rear section of the guide pins after the guide pins 76 have been fit through the holes 80 in the nut mating plate 74. In such an arrangement, the nut mating plate 74 is capable of moving forward toward the guide pin block 72 against the biasing force of the springs 78 mounted around the guide pins 76.

The axial adjustment nut 64 is affixed by screws 66 to the nut mating plate. As above, the adjustment nut 64 may be made adjustable as a result of the screws 66 fitting within the arcuate slots 68. It is understood that the slots 68 may be omitted in this embodiment and replaced by screw holes to prevent rotation of, and manual adjustment by, the nut 64.

In the embodiment of FIG. 6, the shaft 58 extends rearward through the bearing 54, the opening in the actuator 36, and through central openings in the guide pin block and nut mating plate so that the threads are received within the central opening of the adjustment nut 64 as described above. According to this embodiment, in addition to any manual adjustment of the extent to which the latch key protrudes past the surface of the port door, the guide pin block and nut mating plate together provide self-adjustment of the latch key mounting assembly to accommodate pod and port doors of varying thicknesses, and to provide for engineering tolerances. In particular, in the event a pod door is sufficiently tight against the port door to satisfy objectives of the present invention before the latch key 32 has finished its rotational stroke, instead of further translation of the latch key rearward, the continued rotation of the latch key will instead result in a translation of the adjustment nut 64 and nut mating plate 74 forward toward the guide pin block 72 by compressing the springs 78.

It is understood that adjustment of the angular position of the adjustment nut 64 may in part control the point at which the nut mating plate 74 begins to move toward the guide pin block against the force of springs 78. Additionally, it is understood that the desired compressive force between the port and pod doors according to the present invention may be varied by varying the spring constant and/or degree of preloading of springs 78.

The latch key 32 and slot 33 that receives the latch key preferably include smooth surfaces to minimize particulate generation as the latch key rotates in the slot. Even if particulates are generated, they are trapped within the pod door and would not effect the environment within the process tool. In an alternative embodiment of the present invention shown in FIG. 2A, the latch key may be provided with rollers 35 mounted on a pin 37 through the front end of the shaft 58. The rollers lie in contact with walls of the slot 37 as the latch key translates rearward. The rollers allow the latch key to rotate against the slot 37 wall without generating particulates, even upon a large compressive force between the latch key rollers and the slot walls.

Figure 7A:
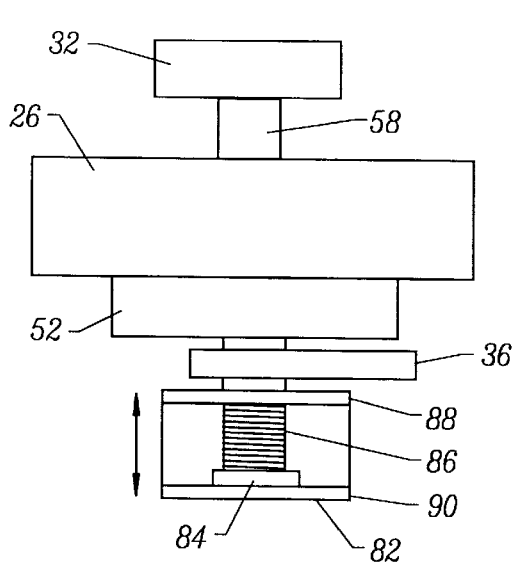
FIG. 7A is a top view of a latch key and mounting components for allowing rotation and translation of the latch key according to a further alternative embodiment.
Figure 7C:
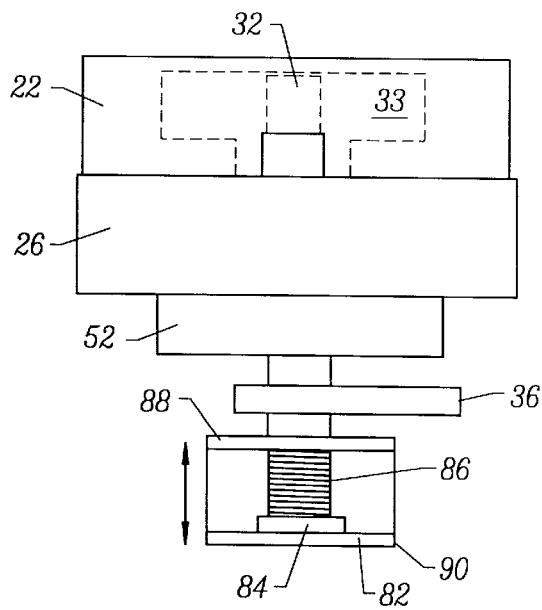
FIG. 7C is a top view of the embodiment of the present invention shown in FIG. 7A in a retracted position.
Figure 7B:
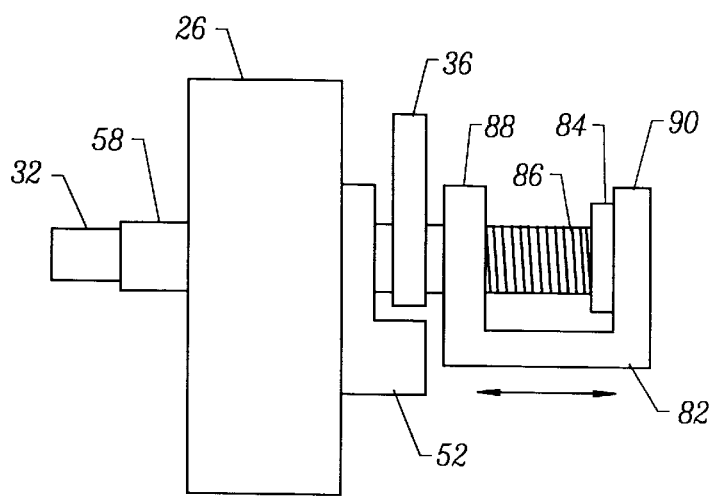
FIG. 7B is a side view of the embodiment of the present invention shown in FIG. 7A.

Although a preferred embodiment of the latch key mounting assembly according to the present invention utilizes the rotation of the latch key to also bring about translation of the latch key, it is understood that the latch key may be translated independently of its rotation. Alternative mechanical systems may be employed for causing the desired translation of latch key 32 and tight engagement between the pod door and port door in alternative embodiments of the present invention. One such alternative embodiment is shown in FIGS. 7A–7C. Referring first to FIGS. 7A and 7B, there is shown a top view of the latch key 32, and the shaft 58 extending rearwardly therefrom and extending through the port door 26, bearing support block 52, and the opening in the actuator 36. This embodiment farther includes a U-shaped bracket 82 translatably mounted within the port door, a washer 84 fixedly attached to the end of shaft 58, and a helical spring 86 wrapped around the shaft 58 and compressed between a front wall 88 of the bracket 82 and the washer 84.

According to the alternative embodiment shown in FIGS. 7A–7C, in a relaxed state, the washer 84 is biased rearwardly by spring 86 and abuts against a rear wall 90 of the bracket 82. In one embodiment, the bracket 82 is initially translated forward (i.e., toward the port door 26) by a known translation mechanism. For example, the bracket 82 may be affixed to and driven by a lead screw or solenoid. This forward translation allows the latch key 32 to seat within the slot in the door latch assembly in the pod door. In alternative embodiments, the latch key may initially be located far enough in front of the port door so that no initial forward translation of the translating bracket 82 is necessary. After or while the actuator 36 rotates latch key 32 to couple the pod door to the port door as described above, the translating bracket may translate rearwardly. Upon such rearward translation, the front wall 88 of bracket 82 will exert a force on spring 86, which in turn exerts a force on washer 84 to move the shaft 58 and latch key 32 rearward, thus pulling the pod door more tightly against the port door.

At some point during the rearward translation of the bracket 82, the pod door 22 will be held sufficiently tight against the port door 26 to accomplish objectives of the present invention. At this point, the force opposing rearward translation of the latch key 32, shaft 58, and washer 84 will overcome the force of spring 86, at which point spring 86 will begin to compress as shown in FIG. 7C. At some predetermined point prior to spring 86 becoming completely compressed, the rearward translation of bracket 82 will cease. Thus, according to this alternative embodiment, spring 86 will act to hold the pod door tightly against the port door, and the mechanism will be self-adjusting to port doors and pod doors of varying thicknesses and tolerances. As in the embodiment of the invention shown in FIG. 6, the desired compressive force between the port and pod doors may be varied by varying the spring constant and/or degree of preloading of spring 86.

As would be appreciated by those of skill in the art, other configurations where translation of the latch key is accomplished independently of its rotation are possible. Another such alternative configuration is similar to that shown in FIGS. 7A through 7C, but the spring 86 and U-shaped bracket 82 may be omitted. In this embodiment, generally, the shaft 58 and latch key would be affixed to a driver such as a lead screw or solenoid which would translate the latch key rearward during or after coupling of the pod door to the port door to provide a tight coupling between the doors. The shaft 58 may, for example, be mounted in a thrust bearing which is in turn mounted for translation to the driver. The thrust bearing would allow the shaft 58 and latch key 32 to rotate, while also exerting an axial load on the shaft to translate the shaft and latch key. According to this embodiment, during or after coupling of the pod door to the port door, the driver would drive the shaft 58 and latch key 32 rearward until a tight engagement between the pod and port doors is established.

In preferred embodiments of the present invention described above, in addition to actuating the pod unlatch assembly and coupling the pod door to the port door, the latch keys 32 establish a tight contact between the pod door and the port door. However, it is understood that mechanisms other than the latch key may accomplish the objective of pulling the pod and port doors into tight engagement. For example, U.S. Pat. No. 4,534,389, entitled "Interlocking Door Latch For Dockable Interface For Integrated Circuit Processing", discloses a spring loaded latch and release cable (FIG. 5 of that Patent) for holding a pod door against the port.

In a further alternative embodiment (not shown), it is contemplated that the port door include one or more magnets mounted in its front surface, which magnets align with a corresponding number of magnets on the rear surface of the pod door. Upon loading of the pod door onto the load port, the N-S poles of the port magnets align with the S-N poles, respectively, of the pod magnets so that the pod door is attracted into firm engagement with the port door. The magnets in the port (or, alternatively in the pod) may be rotationally supported in the port so as to be able to rotate about an axis perpendicular to the surfaces of the port and pod doors. When the pod door is to be returned to the pod, the magnets are rotated so that the N-S poles of the port magnets align with the N-S poles, respectively, of the pod magnets. In this position, juxtaposed magnets will repel each other, and the pod door may be returned to the pod.

Although the invention has been described in detail herein, it should be understood that the invention is not limited to the embodiments herein disclosed. Various changes, substitutions and modifications may be made thereto by those skilled in the art without departing from the spirit or scope of the invention as described and defined by the appended claims.

We claim:

1. A system for transferring a workpiece between a pod and a process tool, the pod having a pod door capable of coupling with a pod shell and the pod door having a slot, the system comprising:

a port door providing an interface to the process tool, said port door defining a plane; and a latch key assembly mounted within the port door, said latch key assembly having a latch key shaped to mate with the slot in the pod door, said latch key assembly further having a mechanism to rotate the latch key about an axis substantially orthogonal with respect to the port door plane in order to couple the pod door to the port door and to move the latch key in a direction along said axis in order to secure the pod door firmly against the port door.

2. The system of claim 1 further comprising means for rotating said latch key upon said latch key being engaged within the slot in the port door.

3. A system for transferring a workpiece between a pod and a process tool, the pod having a pod door capable of coupling with a pod shell, the pod door including a slot, the system comprising:

a port door of an interface to the process tool, the port door defining a plane; and a latch key having a threaded base portion at a first end and a mating portion at a second end opposite the first end, the threaded base portion rotatably mounted to the port door, the mating portion protruding from the port door and shaped to mate with the slot in the pod door via a nut coupled to the port door having a threaded central opening to receive the threaded base portion of the latch key, the threaded base portion causing the mating portion to move in a direction substantially orthogonal with respect to the port door plane to secure the pod door firmly against the port door when mated with the slot and rotated as the pod door is decoupled from the pod and stowed in the process tool during workpiece transfer between the pod and the process tool.

4. The system of claim 3 further comprising a drive mechanism mounted to the port door and coupled to rotate the latch key.

5. The system of claim 3 further comprising a drive mechanism mounted to the port door capable of detaching the pod door from the pod shell.

6. The system of claim 3 wherein the pod door of the pod has a second slot, the system further comprising a second latch key having a threaded base portion at a first end and a mating portion at a second end opposite the first end, the threaded base portion rotatably mounted to the port door, the mating portion of the second latch key protruding from the port door and shaped to mate with the second slot in the pod door, the threaded base portion causing the second latch key to move in the substantially orthogonal direction to secure the pod door firmly against the port door when mated with the second slot and rotated as the pod door is decoupled from the pod and stowed in the process tool during workpiece transfer between the pod and the process tool.

7. The system of claim 3 wherein the mating portion of the latch key includes a pin positioned substantially perpendicular with respect to a longitudinal axis of the latch key, and a first roller mounted on the pin.

8. The system of claim 7 wherein the latch key includes a second roller mounted on the pin.

9. The system of claim 8 wherein the first and second rollers are mounted at opposite ends of the pin.

10. The system of claim 3 wherein the latch key and the slot in the port door have substantially smooth surfaces.

11. The system of claim 3 further comprising a spring-loaded plate defining a hole through which the base portion of the latch key passes and coupled between the threaded nut and the port door to provide self-adjustment of the latch key.

12. A system for transferring a workpiece between a pod and a process tool, the pod including a pod door capable of coupling with a pod shell, the pod door having a plurality of slots, the system comprising:
   a port door to the process tool, the port door defining a plane;
   a plurality of latch keys each having a base portion at a first end and a mating portion at a second end opposite the first end, the base portions being threaded and mounted to the port door, the mating portions protruding from the port doors the mating portions shaped to mate with the plurality of slots in the pod door and being rotatable;
   a plurality of nuts each coupled to the port door and each having a threaded central opening to receive the threaded base portion of a respective latch key of the plurality of latch keys;
   a plurality of actuators each mounted to the base portion of a respective latch key of the plurality of latch keys;
   a translating rod coupled to the plurality of actuators; and
   a drive mechanism coupled to move the translating rod to cause the plurality of actuators to pivot to cause the plurality of latch keys to rotate and move in a direction substantially orthogonal with respect to the port door plane to secure the pod door firmly against the port door when mated with the plurality of slots, as the pod door is decoupled from the pod and stowed in the process tool during workpiece transfer between the nod and the process tool.

13. A system for transferring a workpiece between a pod and a process tool, the pod including a pod door capable of coupling with a pod shell, the pod door having a slot, the system comprising:
   a port door to the process tool, the port door defining a plane;
   a bracket mounted to the port door, the bracket defining a front wall and a rear wall the front wall having an opening to receive the base portion of the latch key; and
   a latch key assembly comprising a latch key with a base portion at a first end and a mating portion at a second end opposite the first end, the base portion mounted to the bracket, the mating portion protruding from the port door, the mating portion shaped to mate with the slot in the pod door, the latch key assembly further comprising means for moving the latch key in a direction substantially orthogonal with respect to the port door plane to secure the pod door firmly against the port door when mated with the slot, as the pod door is decoupled from the pod and stowed in the process tool during workpiece transfer between the pod and the process tool.

14. The system of claim 13 further comprising a helical spring wrapped around the base portion of the latch key, the spring having a relaxed state, in which the spring is in contact with both the front wall and the rear wall of the bracket, and a compressed state, in which the spring is compressed against the front wall of the bracket to move the latch key in the substantially orthogonal direction to secure the pod door firmly against the port door when mated with the slot as the pod door is decoupled from the pod and stowed in the process tool during workpiece transfer between the pod and the process tool.

15. A system for transferring a workpiece between a pod and a process tool, the pod including a pod door and a pod shell, the pod door including a slot, the system comprising:
   a port door to the process tool, the port door defining a plane;
   a latch key having a base portion at a first end and a mating portion at a second end opposite the first end, the mating portion protruding from the port door, the mating portion capable of mating within the slot in the pod door;
   a mounting assembly in the port door for rotatably and translatably mounting the base portion of the latch key to the port door;
   a drive assembly for rotating the latch key and driving the latch key in a direction substantially orthogonal with respect to the plane of the port door to draw the pod door into firm engagement with the port door, upon the mating portion being engaged within the slot, as the pod door is decoupled from the pod and stowed in the process tool during workpiece transfer between the pod and the process tool.

16. The system of claim 15, wherein rotation of the latch key affixes the pod door to the port door upon the mating portion being engaged within the slot.

17. The system of claim 16, wherein translation of the latch key in the direction substantially orthogonal to the plane of the port door draws the pod door into firm engagement with the port door upon the mating portion being engaged within the slot.

18. A system for transferring a workpiece between a pod and a process tool, the pod having a pod door capable of coupling with a pod shell, the pod door including a slot, the system comprising:
  a port door of an interface to the process tool, the port door defining a plane and having an outer side and an inner side;
  a latch key having a mating portion protruding from the outer side of the port door and a threaded shaft extending through the port door to define a base portion opposite the mating portion and protruding from the inner side of the port door, the mating portion shaped to mate with the slot in the pod door, the threaded shaft causing the latch key to move in a direction substantially orthogonal with respect to the port door plane to secure the pod door firmly against the port door when the threaded shaft is rotated in the port door as the pod door is decoupled from the pod and stowed in the process tool during workpiece transfer between the pod and the process tool; and
  a bracket coupled to the base portion of the latch key.

19. The system of claim 18 wherein the bracket has a front wall and a rear wall, the shaft of the latch key extending through the front wall such that at least a part of the base portion of the latch key is situated between the front wall and the rear wall.

20. The system of claim 19 wherein the bracket further includes a side member coupling the front wall to the rear wall.

21. The system of claim 19 further comprising a spring disposed around the part of the base portion situated between the front wall and the rear wall of the bracket.

22. The system of claim 21 further comprising a washer attached to the base portion of the shaft, the spring situated between the front wall of the bracket and the washer.

23. The system of claim 18 wherein the bracket is translatable along an axis defined by the shaft in a forward direction towards the port door and in a rearward direction away from the port door to define:
  a relaxed state, wherein the spring biases the washer in the rearward direction, the washer abutting the rear wall of the bracket: and
  a compressed state, wherein the spring is compressed between the front wall of the bracket and the washer, the washer being spaced apart from the rear wall of the bracket.

24. A system for transferring a workpiece between a pod and a process tool, the pod having a pod door capable of coupling with a pod shell, the pod door including a slot, the system comprising:
  a port door of an interface to the process tool, the port door defining a plane and having an outer side and an inner side;
  a latch key having a mating portion protruding from the outer side of the port door and a shaft extending through the port door to define a base portion opposite the mating portion and protruding from the inner side of the port door, the mating portion shaped to mate with the slot in the pod door and moveable in a direction substantially orthogonal with respect to the port door plane to secure the pod door firmly against the port door when mated with the slot as the pod door is decoupled from the pod and stowed in the process tool during workpiece transfer between the pod and the process tool;
  a bracket having a front wall and a rear wall, the shaft of the latch key extending through the front wall such that at least a part of the base portion of the latch key is situated between the front wall and the rear wall;
  a washer attached to the base portion of the latch key; and
  a spring disposed around the part of the base portion situated between the front wall of the bracket and the washer;
  the bracket being translatable along an axis defined by the shaft in a forward direction towards the port door and in a rearward direction away from the port door to provide:
    a relaxed state, wherein the spring biases the washer in the rearward direction, the washer abutting the rear wall of the bracket, and
    a compressed state, wherein the spring is compressed between the front wall of the bracket and the washer, the washer being spaced apart from the rear wall of the bracket.

25. A system for transferring a workpiece between a pod and a process tool, the pod having a pod door capable of coupling with a pod shell, the pod door including a slot, the system comprising:
  a port door of an interface to the process tool, the port door defining a plane and having an outer side and an inner side;
  a latch key having a mating portion protruding from the outer side of the port door and a shaft extending through the port door to define a base portion opposite the mating portion and protruding from the inner side of the port door, the mating portion shaped to mate with the slot in the pod door; and
  a mounting assembly coupled to the base portion of the latch key, the mounting assembly comprising means for driving the latch key, independent of any rotation of the latch key, in a substantially orthogonal direction with respect to the port door plane to secure the pod door firmly against the port door when mated with the slot as the pod door is decoupled from the pod and stowed in the process tool during workpiece transfer between the pod and the process tool.

26. A system for coupling a front opening universal pod and a process tool, the system composing:
  a port door providing an interface to the process tool, said port door defining a plane; and
  a latch key assembly mounted within the port door, said latch key assembly comprising a latch key having cam followers and being shaped to mate with a slot in the pod door, the latch key assembly comprising means for rotating the latch key about an axis substantially orthogonal with respect to the port door plane to couple the pod door to the port door by contacting said cam followers with the pod door after mating with said slot, the latch key assembly further comprising means for moving the latch key in a direction along said axis upon rotation about said axis to secure the pod door firmly against the port door.

27. A system for opening a front opening universal pod, the system comprising:
  a pod having a front opening pod door;
  a port door defining a plane; and a latch key having a threaded portion rotatably mounted within the port door, said latch key having cam followers and being shaped to mate with a slot in the pod door, the latch key coupling the pod door to the port door by contacting said cam followers with the pod door after mating with said slot, the threaded portion of the latch key causing the latch key to move in a direction along said axis upon rotation about said axis to secure the pod door firmly against the port door.

28. A system for opening a front opening universal pod, the system comprising:

a pod having a front opening pod door;

a port door defining a plane;

a latch key mounted within the port door, said latch key being shaped to mate with a slot in the pod door and adapted to rotate about an axis, the latch key having a shaft with a threaded portion;

an actuator mounted to the shaft of the latch key, the actuator adapted to pivot whereby the latch key is rotated;

a mounting block attached to the port door, said mounting block positioned to allow translation of the actuator along the axis of rotation of the latch key; and an axial adjustment nut adjustably mounted to the mounting block opposite the pod door, said axial adjustment nut having a threaded opening adapted to receive the threaded shaft portion of the latch key such that rotation of the latch key about the axis of rotation provides translation of the latch key and actuator along the axis of rotation.

29. The system of claim 28, further comprising a motor adapted to rotate said actuator.

30. The system of claim 28, wherein the actuator is adapted to rotate the latch key approximately 90°.

31. The system of claim 20, wherein said latch key further comprises cam followers adapted to contact the pod door upon rotation of the latch key inside said slot of the pod door.

* * * * *